United States Patent [19]

Annerino et al.

[11] Patent Number: 5,513,996
[45] Date of Patent: May 7, 1996

[54] CLIP AND METHOD THEREFOR

[75] Inventors: Frank Annerino, Lombard; Scott Semenik, Lake Zurich; John B. Freese, Palatine, all of Ill.

[73] Assignee: Motorola, Inc., Schaumburg, Ill.

[21] Appl. No.: 309,211

[22] Filed: Sep. 20, 1994

[51] Int. Cl.⁶ .................................................. H01R 13/648
[52] U.S. Cl. ......................................... 439/95; 174/35 GC
[58] Field of Search ............................. 439/95, 816, 861; 24/563, 546, 295; 174/35 R, 35 GC

[56] References Cited

U.S. PATENT DOCUMENTS

| | | | |
|---|---|---|---|
| 963,747 | 7/1910 | Crothers et al. | 24/563 |
| 2,844,644 | 7/1958 | Soule, Jr. | 174/35 GC |
| 3,627,900 | 12/1971 | Robinson | 439/95 |
| 4,652,695 | 3/1987 | Busby | 174/35 GC |
| 4,889,959 | 12/1989 | Taylor et al. | 439/95 |
| 5,015,802 | 5/1991 | Chi | 174/35 GC |
| 5,233,507 | 8/1993 | Gunther et al. | 174/35 GC |

FOREIGN PATENT DOCUMENTS

| | | | |
|---|---|---|---|
| 496700 | 10/1953 | Canada | 24/295 |
| 3436119 | 4/1986 | Germany | 439/95 |
| 840556 | 7/1960 | United Kingdom | 24/295 |

*Primary Examiner*—Gary F. Paumen
*Attorney, Agent, or Firm*—Randall S. Vaas

[57] ABSTRACT

An electrically conductive clip (100) includes a first contact surface (116) facing a first direction, a second contact surface (118) facing a second direction different from the first direction, and a third contact surface (122) facing a third direction different from the first and second directions. The clip is biased to exert a force in the first, second, and third directions.

17 Claims, 6 Drawing Sheets

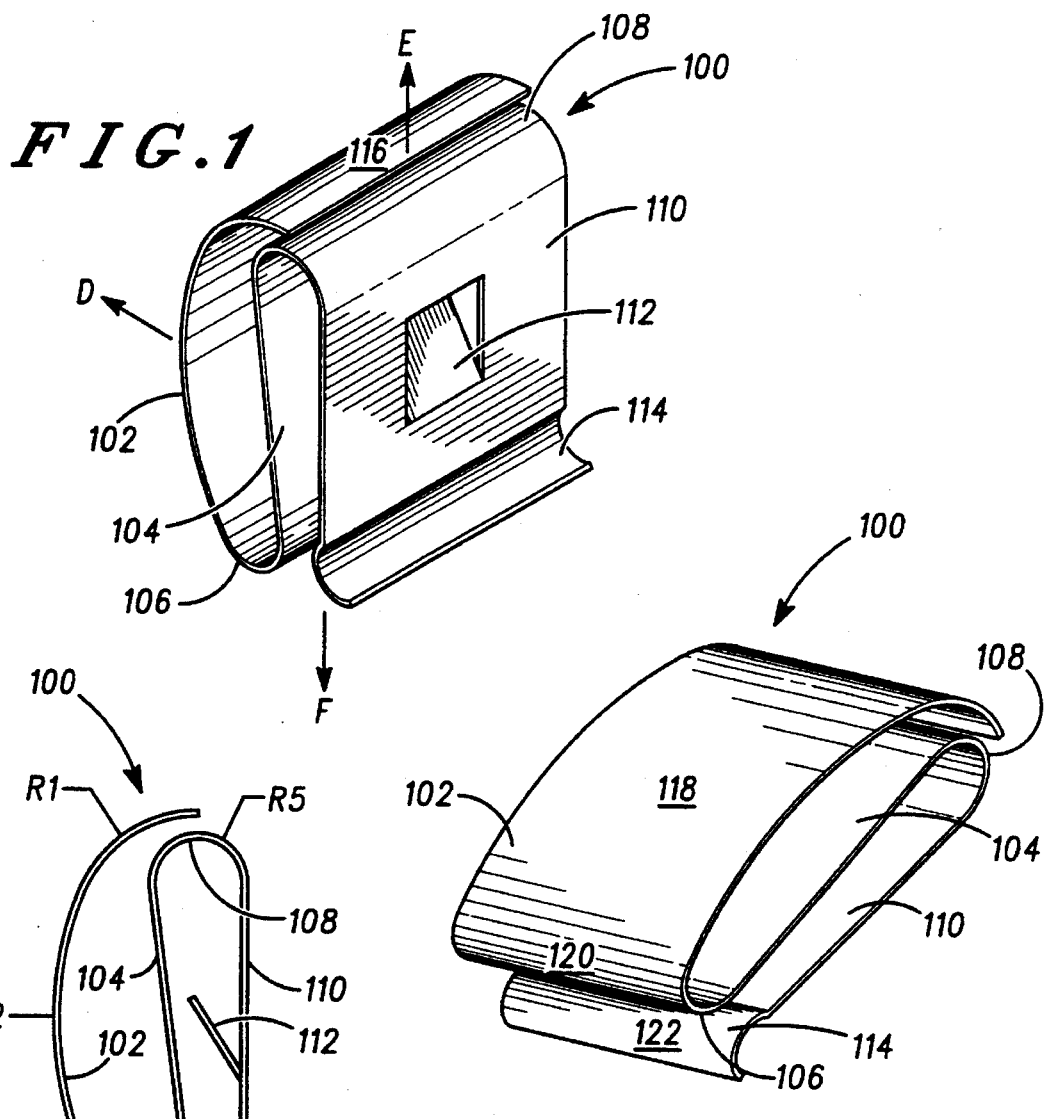
FIG.1
FIG.2
FIG.3
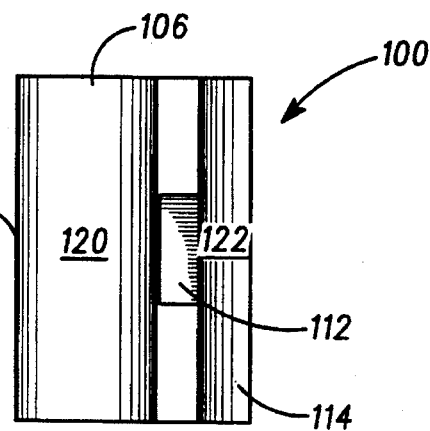
FIG.4

CLIP AND METHOD THEREFOR

FIELD OF THE INVENTION

The present invention pertains to electrical grounding clips.

BACKGROUND OF THE INVENTION

Electronic devices are well known that include electronic circuits mounted on electronic circuit boards. It is important that these electronic circuits are adequately grounded for proper operation. One method of grounding circuits is to provide a relatively large electrically conductive member as a ground plane. Ground conductors of the electronic circuits are connected to this conductive member to effect circuit ground. One electrically conductive member that is often used in electronic devices is an electrically conductive layer on the interior surface of the device's housing.

A difficulty experienced by electronic device manufacturers is providing an effective ground connection between the electronic circuit and the large conductive element which is reliable and inexpensively assembled. Providing an electrical connection between the circuit board and the ground member using wires and solder increases the assembly time, and the overall complexity and cost of manufacturing the electronic devices. Known mechanical connectors contacting surfaces on the circuit board and ground member are expensive and challenge assemblers attempting to consistently insure that electrical connection is made.

Accordingly it is desirable to provide an electrical connector which is readily assembled in an electronic device and reliably connects the circuit board to the ground member.

BRIEF DESCRIPTION OF THE DRAWINGS

FIG. 1 is a front perspective view illustrating a clip;

FIG. 2 is a rear perspective view illustrating the clip from an opposite direction of FIG. 1;

FIG. 3 is a side elevational plan view illustrating the clip of FIG. 1;

FIG. 4 is a bottom plan view illustrating the clip according to FIG. 1;

DETAILED DESCRIPTION OF THE DRAWINGS

Figure 5:
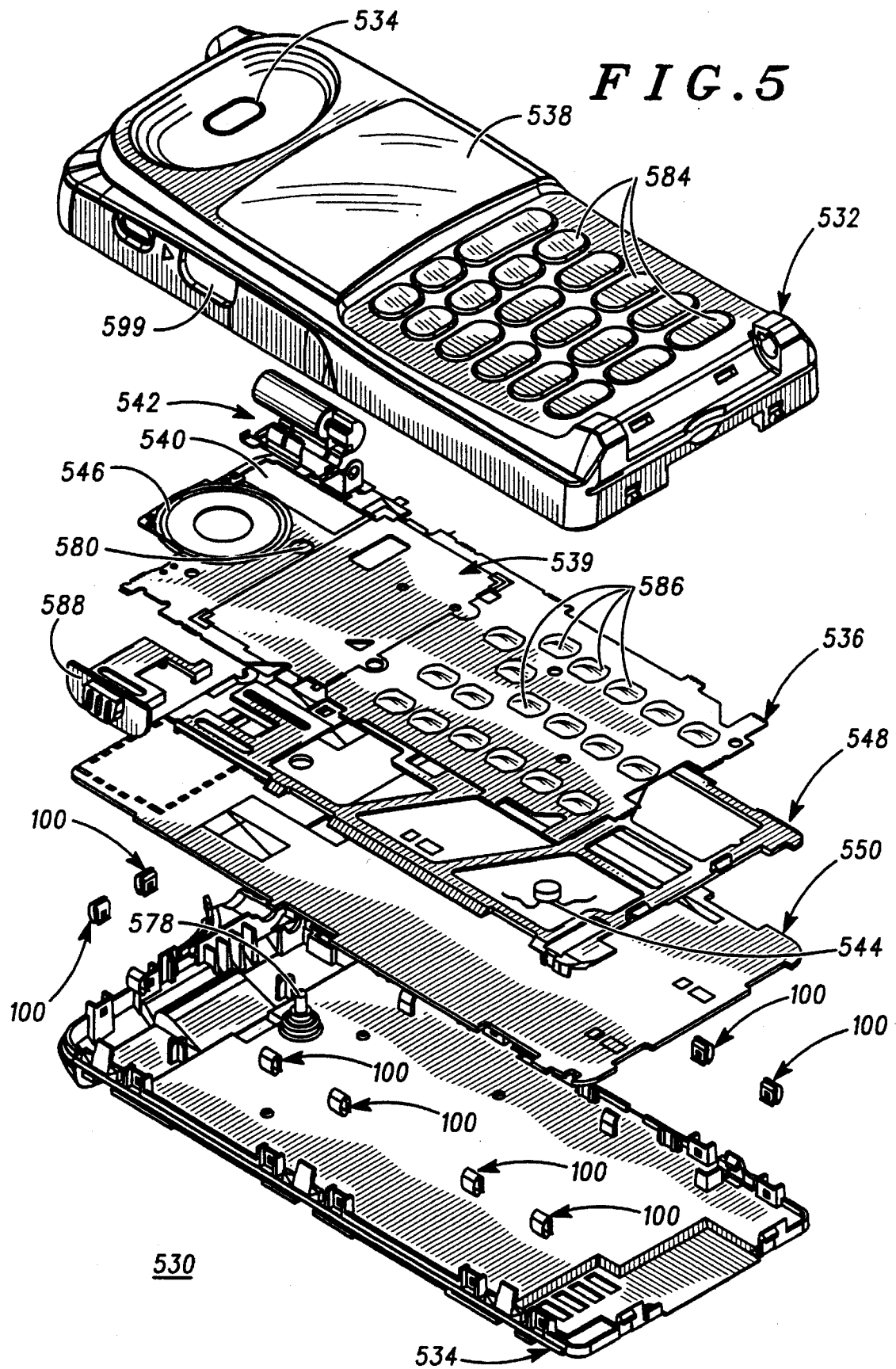
FIG. 5 is an exploded perspective view illustrating a radio telephone including a clip.

A clip 100 (FIG. 1) is manufactured of a resilient conductive material. The clip includes three contact surfaces 116, 118, and 122 which are spaced from one another for engagement with three mating surfaces of a device in which the clip is used. Each of the contact surfaces is oriented to make contact with a mating surface on the device that is in a different plane. The clip is configured to impart a predetermined force in a direction (E, D, and F) substantially orthogonal to the plane of each contact surface when the clip is assembled in the device. The clip can therefore be readily assembled in an electronic device and provide a secure contact with mating surfaces in different planes thereof to facilitate assembly and reliable electrical interconnection of electrically conductive components.

Clip 100 (FIG. 1) includes a bow 102 connected to a central plate 104 by a first elbow 106. A second elbow 108 (FIG. 2) interconnects a central plate 104 with arm 110. Arm 110 includes a barb 112 (FIG. 3) which functions as an attachment mechanism for the clip. Although the illustrated attachment mechanism is an integrally formed barb, it may be an integral dimple, a separate fastener, or any other suitable connector. A finger 114 extends from an end of arm 110 remote from first elbow 106. First elbow 106 and second elbow 108 extend from opposite ends of central plate 104 such that the clip is generally S-shaped in profile. Bow 102 includes a contact surface 116 (FIG. 1) at the apex of the clip, a contact surface 118 (FIG. 2) at the leftmost projecting point of bow 102, and a contact surface 120 (FIG. 4) at the bottom location in first elbow 106. Finger 114 also includes a contact surface 122 at the end thereof.

Clip 100 is manufactured of a beryllium and copper alloy that is one-half hard and heat treated at approximately 600° F. for 2 hours. However, the clip may be manufactured of other suitable electrically conductive, resilient materials, such as other copper alloys, an electrically conductive polymeric constructions, or the like. The clip is resilient to resist movement at each of the contact surfaces but allows some collapsing of the clip to conform to marginally different volumes. Additionally, the configuration of the clip provides a predetermined force at each of the contact surfaces in a direction tangential to each of the contact surfaces to push the contact surfaces against the device surfaces thereby making a reliable electrical connection at the contact surfaces. The clip is electrically conductive to electrically interconnect all of the contact surfaces that it contacts.

The clip has a thickness of between 0.05 millimeters (mm) and 1.1 mm, and in a reduction to practice had a thickness of approximately 0.08 mm. The bow 102 includes a top segment having a radius R1 between 0.25 mm and 0.35 mm, and in the reduction to practice had a radius of approximately 0.32 mm through an arc of approximately 70.9°. The intermediate segment of the bow has a radius R2 between 2 mm and 4 mm, and in the reduction to practice, had a radius of approximately 2.96 mm in an arc of approximately 57.9°. First elbow 106 has a first segment with a radius R3 that is between 0.25 mm and 0.75 mm, and in the reduction to practice, had a radius of approximately 0.59 mm through an arc of approximately 55°. First elbow 106 has a second segment having a radius R4 between 0.25 mm and 85 mm, and in one reduction to practice had a radius of approximately 0.62 mm. through an arc of approximately 97.4°. The second elbow 108 has a radius between 0.25 mm and 0.55 mm, and in the reduction to practice has a radius of approximately 0.48 mm through an arc of approximately 187.4°. The finger has a radius between 0.10 mm and 0.5 mm, and in the reduction to practice had a radius of 0.28 mm through an arc of approximately 148.3°. The configuration is such that contact surfaces 116, 118, 120 and 122 are in different planes in the at rest condition illustrated in FIGS. 1–4.

Figure 9:
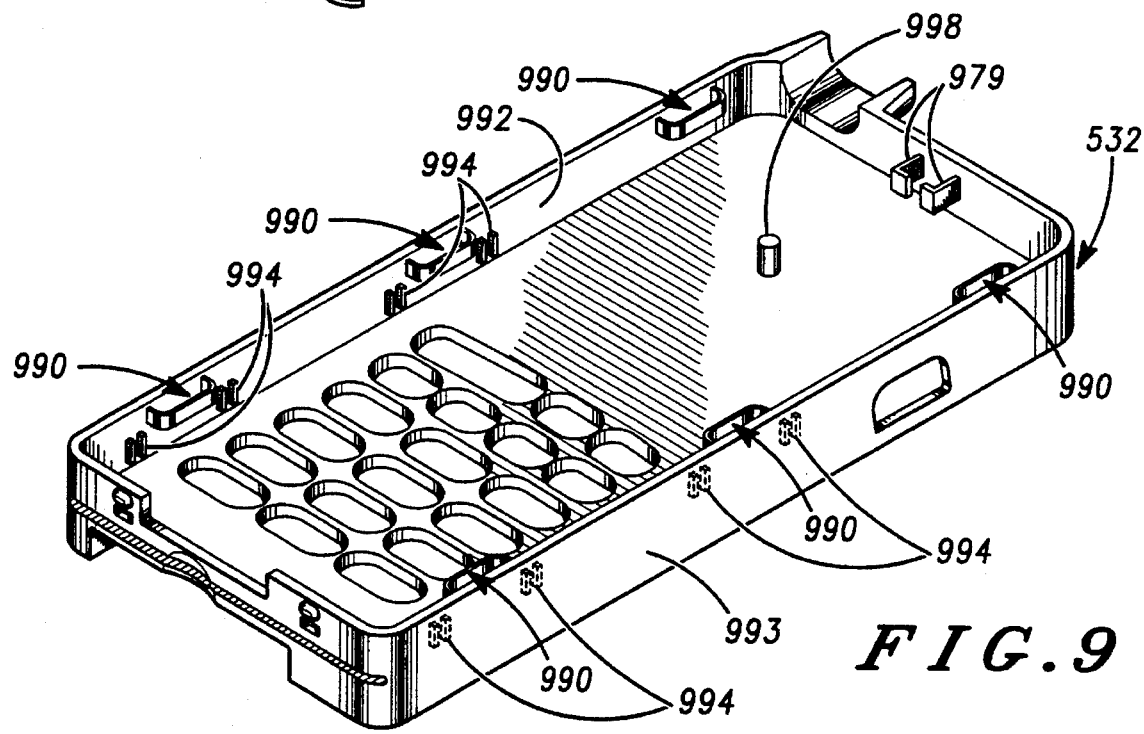
FIG. 9 is a bottom perspective view illustrating the front housing section of the radio telephone of FIG. 1.

A radio telephone 530 (FIG. 5) employing clips 100 includes a front housing section 532 and a rear housing section 534 which are interconnected to form an outer casing defining an interior volume. A logic circuit board 536 has a display lens 539, an opening 540 for receipt of a vibrator assembly 542, a microphone 544, a speaker 546, and other electronic circuitry not specifically shown or referenced, mounted thereon. A slider web 548 is positioned between logic circuit board 536 and a radio frequency (RF) circuit board 550. RF circuit board 550 has electronic circuitry (not shown) assembled thereon. The RF circuit board 550 is sandwiched between stops 994 (FIG. 9) on front housing section 532 and rear housing section 534, the stops holding the RF circuit board 550 in position when the radio telephone is assembled. The front housing section 532 and rear housing section 534 enclose logic circuit board 536, slider web 548, and RF circuit board 550 when fully assembled. Clips 100 are supported in the radio telephone such that they exert a force against electrical conductors on the rear housing section 534, the front housing section 532, and the printed circuit board 550, thereby making a reliable electrical connection between conductive surfaces of these parts, as described in greater detail herein below.

Radio telephone as used herein refers to cellular telephones, portable telephones, or cordless telephones. Although a portable radio telephone 530 is illustrated, the clips 100 may be advantageously employed in other electronic devices such as land line telephones, radios, pagers, or any other electronic appliance. Accordingly, "device" as used herein refers to all such electronic appliances and their equivalents.

Rear housing section 534 (FIG. 6) includes rear housing section snaps 660 positioned at locations spaced around the perimeter of rear housing section 534. The rear housing section snaps 660 are all substantially identical. Each rear housing section snap includes a resilient arm 762 (FIG. 7) extending outwardly from the rear housing section platform 764 at an opening 766. A wedge 768 projects from a distal end of arm 762. The wedge 768 includes a top surface 770 that slopes toward the apex 772 of arm 762.

Figure 8:
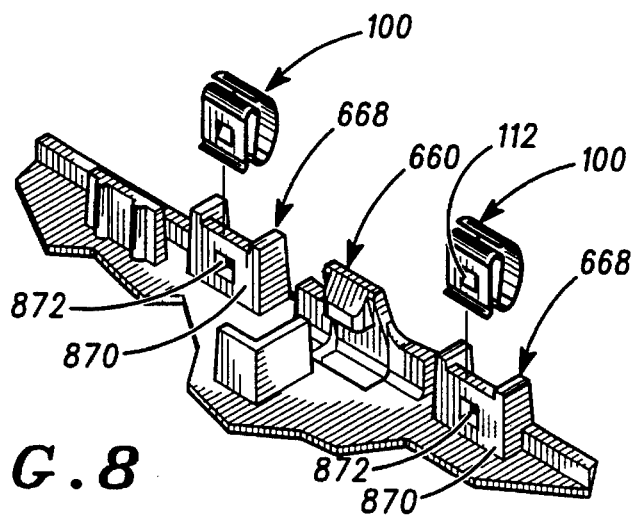
FIG. 8 is an enlarged exploded perspective view illustrating the back housing section and clips.

The rear housing section 534 (FIG. 6) also includes mounting posts 668 at spaced locations around the perimeter thereof. The mounting posts 668 include a generally rectangular planar body 870 (FIG. 8) having a central opening 872. Central opening 872 is for receipt of barb 112 (FIG. 3). The central planar member extends between protuberances 874 and 876. The mounting posts 668 (FIG. 6) are preferably located adjacent the back housing section snaps 660, and may be positioned on opposite sides of one or more of these snaps.

Figure 6:
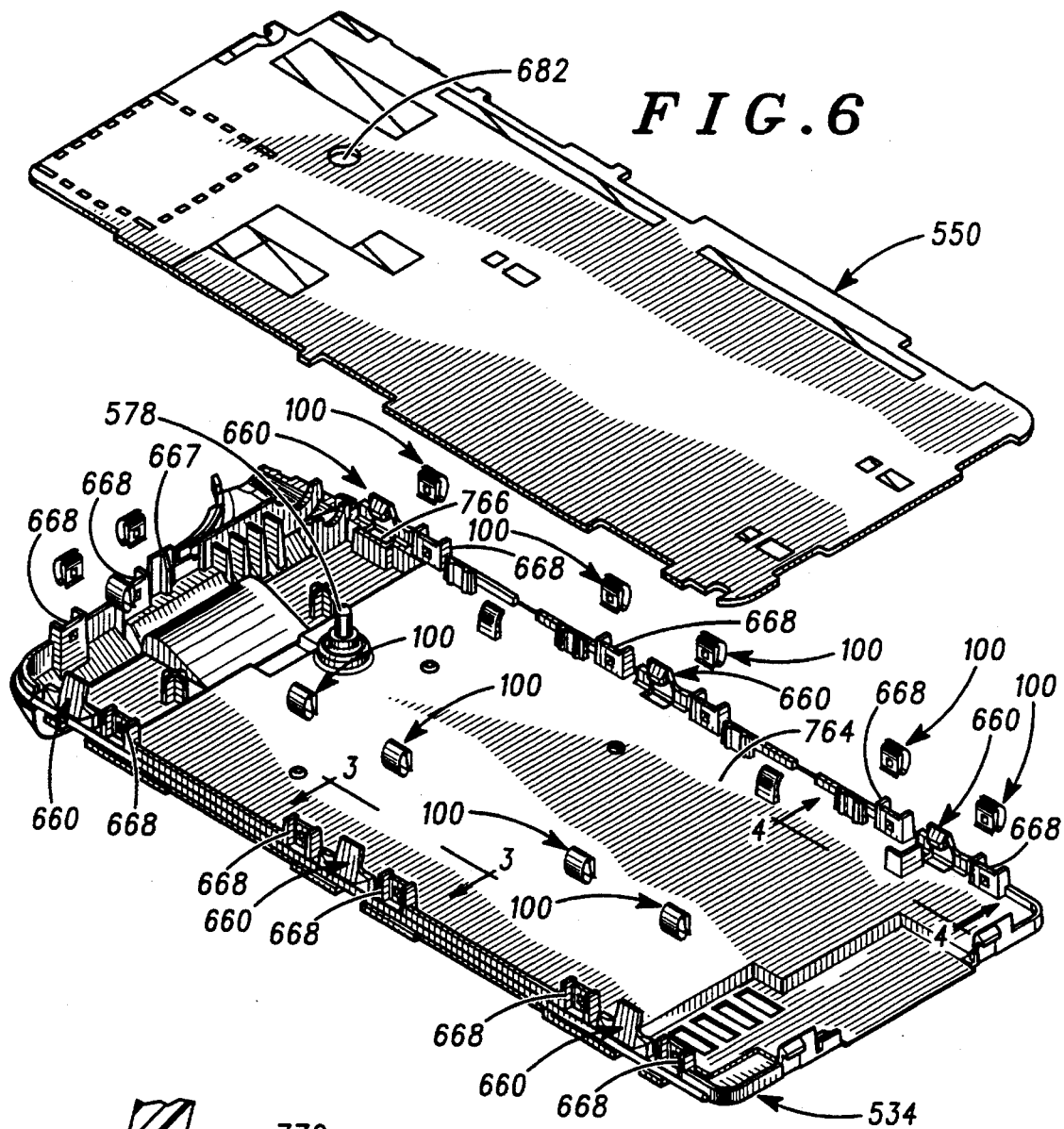
FIG. 6 is an enlarged exploded perspective view illustrating a rear housing section assembly, clips, and a printed circuit board.
Figure 7:
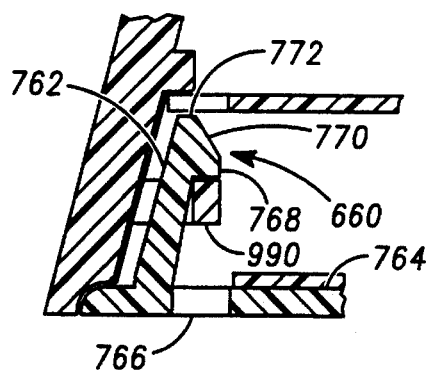
FIG. 7 is a fragmentary cross-sectional view of the front housing section, back housing section printed circuit board taken along plane IX—IX in FIG. 6.

A positioning post 578 (FIG. 5) on back housing section 534 provides a guide mechanism for locating logic circuit board 536 and RF circuit board 550. For this purpose logic circuit board 536 includes an opening 580 and RF circuit board 550 includes opening 682 (FIG. 6). Openings 580 and 682 receive positioning post 578. Positioning post 578 is located such that when the post is received in openings 580 and 682 while the circuit boards are properly oriented with respect to the front and back housing section sections 532 and 534, the printed circuit boards are aligned for full assembly of the telephone housing section sections.

Front housing section 532 (FIG. 5) includes a speaker opening 534, a display lens 538, and key pads 584 (only some of which are numbered). Key pads 584 are positioned to actuate popple switches 586 on logic circuit board 536 when the key pads are pressed. A speaker 546 is supported behind speaker opening 534 in front printed circuit board 536. A slide switch 588 for discharging memory cards is positioned inside front housing section 532 and tracks on slider web 548.

The front housing section 532 also includes arcuate staples 990 (FIG. 9) extending outwardly from the sidewalls 992 and 993 of the front housing section 532. Stops 994 project from the inside surface of sidewalls 992 and 993.

The front housing section 532 and the back housing section 534 are manufactured of conventional materials and by a convention manufacturing process for electronic devices. For example, they may be an integrally molded of an organic polymer. An electrically conductive layer 1395 (FIG. 13) is supported on the interior surface of the front housing section 532. An electrically conductive layer 1396 is similarly supported on the interior surface of back housing section 534. The electrically conductive layers 1395 and 1396 are manufactured of a conductive material, such as a metal member mounted near the interior of the housing section, a metallized film applied directly to the interior of the housing section using a suitable conventional process, or any other suitable conductor which covers a relatively large surface area. Layers are preferably a metallized film, or surface material, applied to the interior surface of the front housing section 532 and back housing section 534, as this provides a light-weight and relatively small volume circuit ground.

Figure 10:
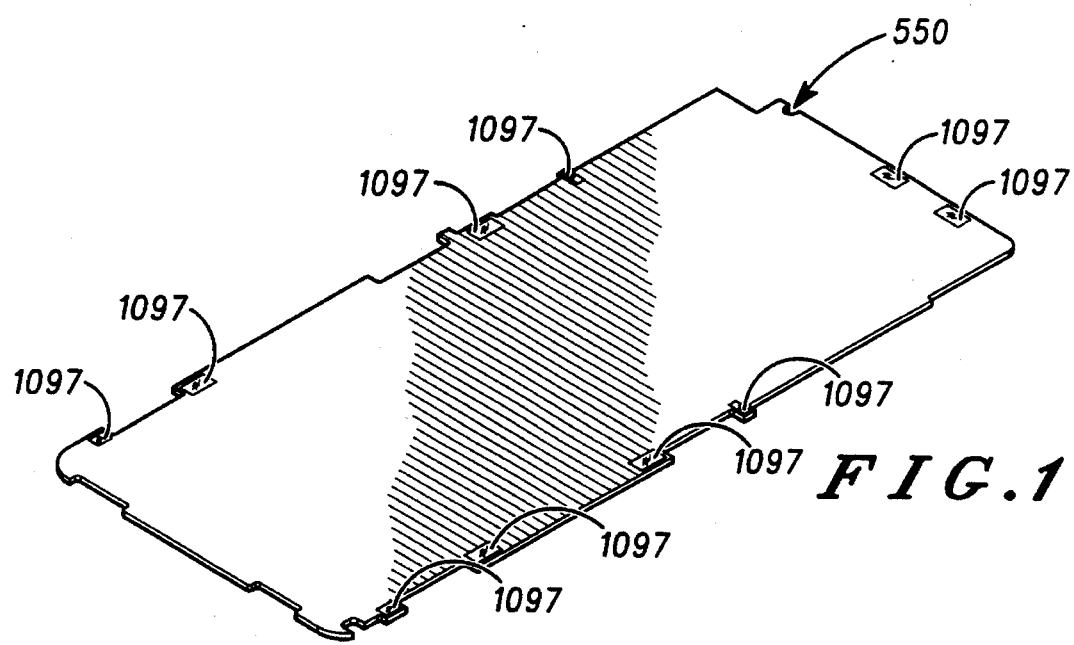
FIG. 10 is a bottom perspective view illustrating the RF circuit board of FIG. 1.

Contacts 1097 (FIG. 10) are supported at predetermined locations of the perimeter of the RF circuit board 550. Contacts 1097 are formed on the circuit board by conventional printing processes. These contacts are connected to ground conductors (not shown) on the RF circuit board. The ground conductors are in turn connected to terminals of integrated circuits (not shown), impedance devices and the like, mounted on the printed circuit board which are connected to circuit ground.

Figure 13:
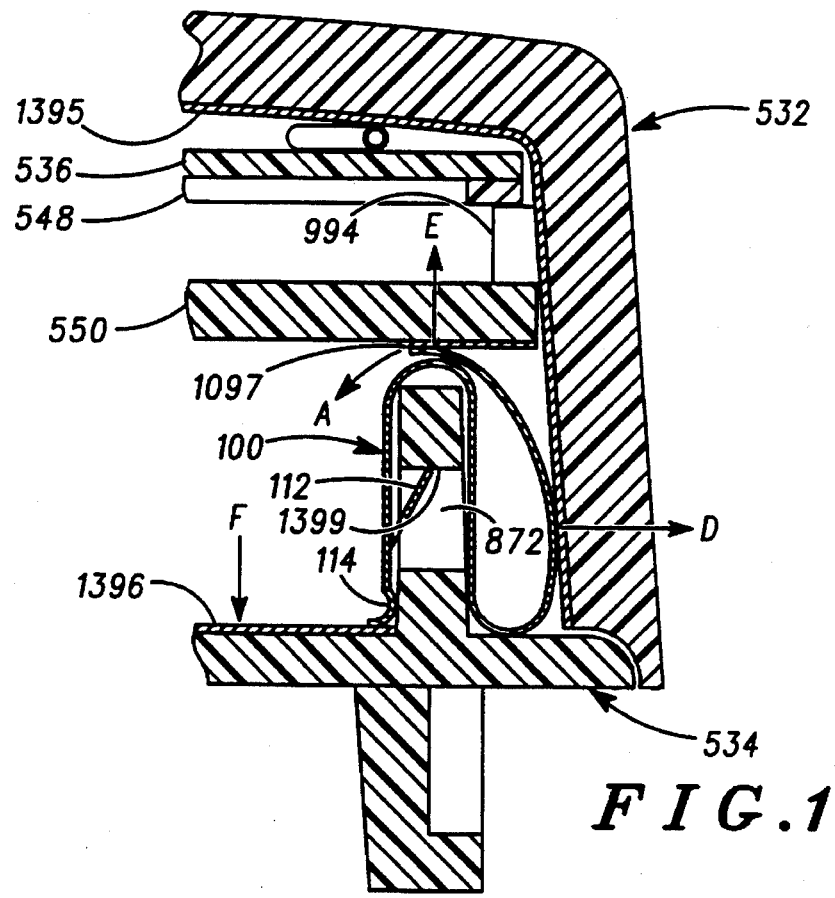
FIG. 13 is a fragmentary cross-sectional view illustrating the radio telephone components cut along plane VI—VI in FIG. 6.

To assemble a grounding clip 100 (FIG. 8) to a mounting post 668, the grounding clip is positioned above planer member 870 with the barb 112 aligned with opening 872. First elbow 106 (FIG. 3) and finger 114 have curved surfaces which contact the top of wall 668. These curved surfaces slide over corners of post 668 and push central plate 104 and arm 110 away from one another such that the mounting wall is received therebetween. Barb 112 slides over wall 668 until it moves over recess 872. The barb will then snap into opening 872 and the clip is held securely on the wall as shown in FIG. 13. In this position, finger 114 is pressed against the metallized inner layer 1396 of the back housing section and the pressure exerted by barb 112 against wall 1399 slightly compresses finger 114.

The logic circuit board 106 is assembled into front housing section 532. The circuit boards 536 and 550 are positioned at predetermined locations in this housing section by positioning post 578 through aperture 580 and aperture 682 (FIG. 6). The logic circuit board 550 is also positioned by web 112, which hold the logic board within the front housing section 532, and slide switch 588, received in aperture 599 in the front housing section 102. The RF circuit board is then positioned over the web, such that post 578 is received in aperture 682 (FIG. 6).

The front housing section 532 (FIG. 5) and back housing section 534 are interconnected after the logic circuit board 536 and RF circuit board 550 are positioned in the front housing section. The back housing section snaps 660 engage staples 990 (FIG. 9) on front housing section 532 to hold these sections together. The front housing section 532 preferably includes an integral cylinder 998 for receipt of the positioning post 578 of the back housing section. An additional alignment mechanism may be provided by a guide member 677 (FIG. 6) on back housing section 534, which slides into a rail 979 in front housing section 532.

The top surface 770 (FIG. 7) of wedge 768 slides against the staple 990 to push arm 762 inwardly and the staple deflects outwardly. After the wedge slides past the staple, the resilient arm pushes the wedge over the staple to the position illustrated in FIG. 7. In this position, the bottom surface of the wedge rests against the top surface of the staple. To separate the snap connector from the staple, an implant is inserted through flexible arm opening 766 and is used to separate the wedge and the staple.

Figure 12:
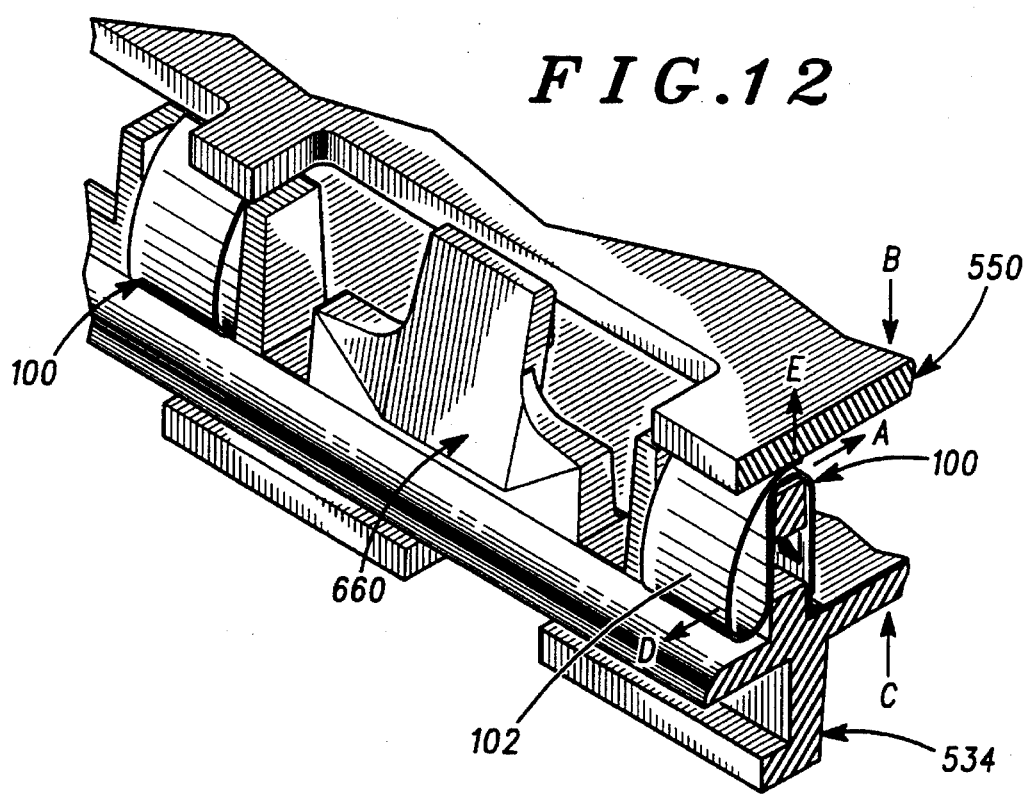
FIG. 12 is a fragmentary perspective view illustrating a printed circuit board, clips, and back housing section cut along plane VI—VI in FIG. 6.

When the back housing section 534 is assembled to the front housing section 532, the bow 102 is pushed downwardly by the RF circuit board moving in direction B (FIG. 12) and the back housing section exerting a force in direction C. This forces bow 102 to move in directions A and D. The bow 102 arcs outwardly in direction D at surface 116 (FIG. 1) providing a firm engagement with the inner surface 1395 (FIG. 13) of front housing section 532. When the bow abuts with the inside surface of the front housing section, the contact surface 116 of the bow 102 will push firmly against the RF circuit board contact 1097 and tend to move in direction A. The RF circuit board contact 1097 abuts with surface 116. The barb 112 pushes finger 114 in direction F at contact surface 122 thereby, providing a firm connection with conductor 1396. Thus, the conductor contacts the circuit board contact 1097, the conductive layer 1395 on the inner surface of the front housing section 532, and the conductive layer 1396 on the inner surface of the back housing section 534. This provides a secure reliable ground connection between the front housing section ground layer, back housing section ground layer, and the printed circuit board ground conductor, thereby effecting a reliable circuit ground connection and avoiding the circuit destruction do to improper grounding.

Because barbs 112 (FIG. 13) of clips 100 are pressed into the top surface of opening 872 by arms 110 when fingers 114 push against electrically conductive layer 1396, layer 1396 is held firmly against contact surface 122 (FIG. 2). The stops 994 (FIG. 13) on the front housing section 532 hold the RF circuit board electrically conductive layer 1305 against the clip surface 116 (FIG. 1). The clip 100 is thus pinched between the back housing section 534 (FIG. 13) and the RF circuit board. This pinching of the clip presses contact surface 118 (FIG. 2) of the clip outwardly against the front housing section conductive layer. The clip thus exerts a force against the conductive layers on front housing section 532, the back housing section, and the RF circuit board, thereby making electrical connection with conductors in three differently oriented planes.

Figure 11:
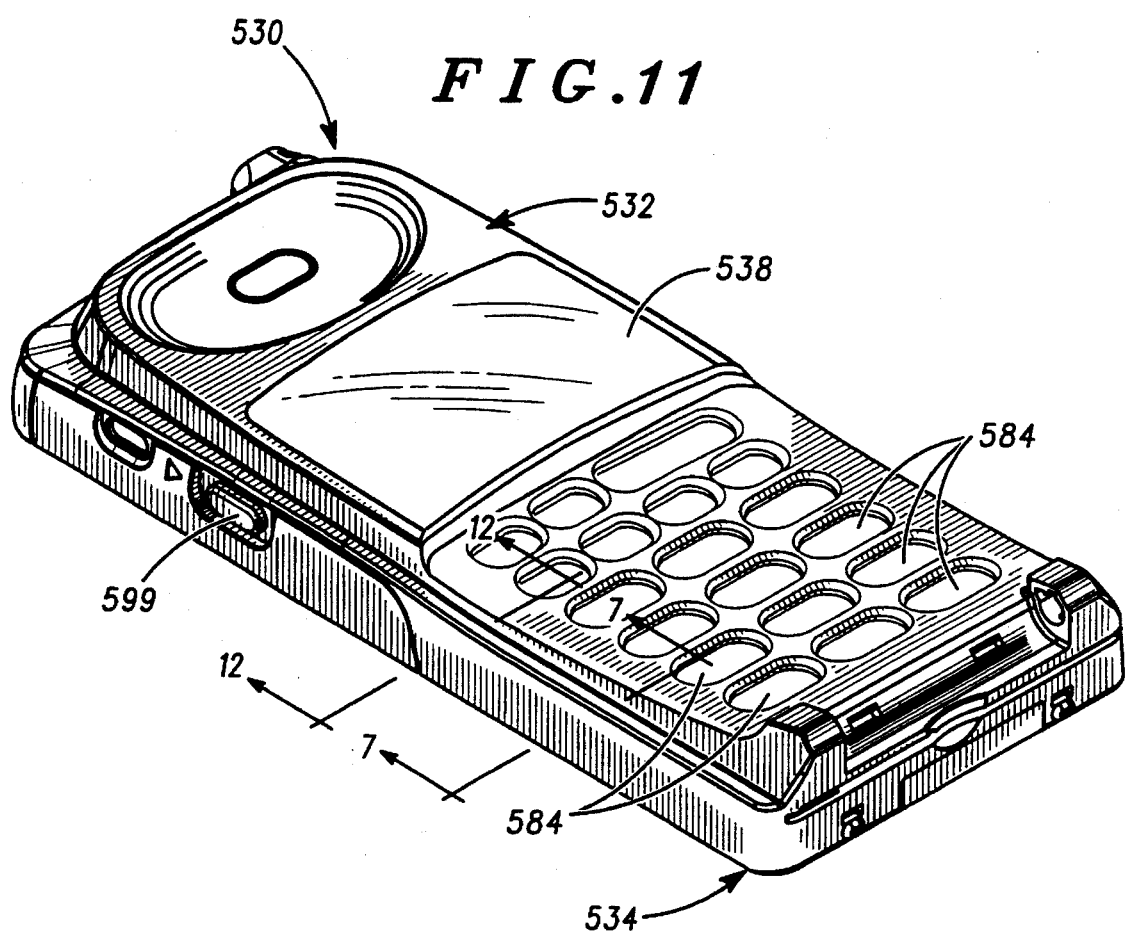
FIG. 11 is a top perspective view illustrating the assembled radio telephone.

The clips are aligned with the contacts on the RF circuit board by the position of mounting posts, the alignment post 378, and sidewalls of the front housing section 532. The fully assembled radio is illustrated in FIG. 11.

Thus it can be seen that a clip is disclosed which is readily assembled into a device. The clip is resilient, such that it makes contact the inside surfaces in different planes, and the movement of the bow allows the clip to reliable contact surfaces in marginally different volumes. The contact may thus be used to provide a ground connection in electrical devices such as radio telephones, pagers, electronic appliances, and the like with a high degree of confidence.

What is claimed is:

1. A radio telephone comprising:
    a front housing section, an electrical conductor carried on the front housing section;
    a back housing section, an electrical conductor carried on the back housing section;
    a circuit board, an electrical circuit carried on the circuit board; and
    a clip supported on one of the front housing section, the back housing section, and the circuit board, the clip including a continuous member having a first contact surface facing a first direction, a second contact surface facing a second direction and a third contact surface facing a third direction, wherein the first contact surface connects with the electrical conductor carried on the first housing and the second contact surface connects with the electrical conductor carried on the back housing section, and the third contact surface connects with electrical circuit on the circuit board.

2. The radio telephone as defined in claim 1, wherein the continuous member further includes an arm having an attachment mechanism for affixing the clip to a support.

3. The radio telephone as defined in claim 2, wherein the continuous member further includes a bow integrally formed with the arm.

4. The radio telephone as defined in claim 3, wherein the member further includes an integral center plate, which together with the arm, forms a holder with a U-shaped profile, the integral bow extending from the holder.

5. The radio telephone as defined in claim 4, wherein the bow extends from one end of the center plate and includes the third and forth contact surfaces.

6. The radio telephone as defined in claim 5, further including an arcuate finger on an end of the arm, the finger including the third contact surface.

7. The radio telephone as defined in claim 6, wherein the attachment mechanism includes a barb projecting away from the center plate.

8. A method of providing a circuit ground in an electronic device including a front housing section having an electrical conductor associated therewith, a back housing section having an electrical conductor associated therewith and a circuit board having an electrical contact thereon, the method comprising the steps of:
    attaching a clip on one of the front housing section, the back housing section, and the circuit board, the clip comprising a continuous member having a first contact surface facing a first direction, a second contact surface facing a second direction and a third contact surface facing a third direction, wherein the continuous member is biased to exert a force in the first, second, and third directions; and
    assembling the housing sections such that the clip makes contact with the circuit board contact and at least one of the electrical conductors on the front and back housing sections.

9. An electrically conductive clip formed by a continuous conductive member, the clip comprising:
    an arm having an attachment mechanism;
    a generally C-shaped bow having a first contact surface and a second contact surface;
    a center plate joined to the arm to form a holder having a U-shaped profile, the bow extending from an end of the center plate, wherein the bow extends away from the center plate to make a resilient contact with a housing surface spaced from the center plate; and an arcuate finger on an extreme distal end of the arm, the arcuate finger including a third contact surface, the arcuate finger being resilient;

wherein the first contact surface facing a first direction, the second contact surface facing a second direction different from the first direction, and the third contact surface facing a third direction, wherein the bow is biased to exert a force in the first and second directions and the finger is biased by the attachment mechanism to exert a force in the third direction.

10. The electrically conductive clip as defined in claim 9, wherein the attachment mechanism includes a barb facing away from the finger.

11. An electronic device comprising:

a first housing member having an electrically conductive layer;

a second housing member having an electrically conductive layer;

a third housing member having an electrically conductive layer; and a clip mounted to the first housing member, the clip including a continuous electrically conductive member having a holder for attachment to the first housing member, and having a first contact surface facing a first direction, a second contact surface facing a second direction and a third contact surface facing a third direction, wherein the continuous member is biased to exert a force in the first, second, and third directions; and wherein first second and third housing members are assembled to form a top, a bottom and a side, such that the third contact surface connects with the electrically conductive layer of the first housing member, the second contact surface connects with the electrically conductive layer of the second housing member, and the first contact surface connects with the electrically conductive layer of the third housing member.

12. The electronic device as defined in claim 11, wherein the holder of the continuous member includes an arm and having an attachment mechanism for affixing the clip to a support.

13. The electronic device as defined in claim 12, wherein the continuous member further includes a bow having the first and second contact surfaces thereon.

14. The electronic device as defined in claim 13, wherein the holder of the continuous member further includes an integral center plate, the arm and center plate having a U-shaped profile, the integral bow extending from one end of the center plate.

15. The electronic device as defined in claim 14, further including an arcuate finger on an end of the arm, the finger including the third contact surface.

16. The electronic device as defined in claim 15, wherein the attachment mechanism includes a barb projecting away from the finger.

17. The electronic device as defined in claim 11, wherein the electronic device is a radio telephone, the first housing member is a back housing having the electrically conductive layer on the interior, and the third housing member is a front housing having the electrically conductive layer on the interior, the second housing member is a circuit board, and the electrically conductive layer on the circuit board is a contact.

* * * * *